(12) United States Patent
Choo et al.

(10) Patent No.: US 9,673,258 B2
(45) Date of Patent: Jun. 6, 2017

(54) ORGANIC PIXELS INCLUDING ORGANIC PHOTODIODE, MANUFACTURING METHODS THEREOF, AND APPARATUSES INCLUDING THE SAME

(71) Applicants: Kyo Jin Choo, Seoul (KR); Hirosige Goto, Suwon-si (KR); Kyu Sik Kim, Jeonbuk (KR); Yun Kyung Kim, Seongnam-si (KR); Kyung Bae Park, Seoul (KR); Jin Ho Seo, Seoul (KR); Sang Chul Sul, Suwon-si (KR); Kyung Ho Lee, Bucheon-si (KR); Kwang-hee Lee, Suwon-si (KR)

(72) Inventors: Kyo Jin Choo, Seoul (KR); Hirosige Goto, Suwon-si (KR); Kyu Sik Kim, Jeonbuk (KR); Yun Kyung Kim, Seongnam-si (KR); Kyung Bae Park, Seoul (KR); Jin Ho Seo, Seoul (KR); Sang Chul Sul, Suwon-si (KR); Kyung Ho Lee, Bucheon-si (KR); Kwang-hee Lee, Suwon-si (KR)

(73) Assignee: Samsung Electronics, Gyeonggi-Do (KR)

( * ) Notice: Subject to any disclaimer, the term of this patent is extended or adjusted under 35 U.S.C. 154(b) by 147 days.

(21) Appl. No.: 14/466,395

(22) Filed: Aug. 22, 2014

(65) Prior Publication Data
US 2015/0054995 A1    Feb. 26, 2015

Related U.S. Application Data

(63) Continuation of application No. 13/650,839, filed on Oct. 12, 2012, now Pat. No. 8,836,839.

(30) Foreign Application Priority Data

Oct. 14, 2011    (KR) .................. 10-2011-0105205

(51) Int. Cl.
*H04N 3/14* (2006.01)
*H01L 27/30* (2006.01)
(Continued)

(52) U.S. Cl.
CPC .......... *H01L 27/307* (2013.01); *H01L 51/424* (2013.01); *H04N 5/3698* (2013.01); *H04N 5/378* (2013.01); *H04N 5/37452* (2013.01)

(58) Field of Classification Search
CPC ............ H01L 27/307; H01L 27/14643; H01L 27/14632; H01L 27/14667; H04N 5/378; H04N 5/37452
(Continued)

(56) References Cited

U.S. PATENT DOCUMENTS 7,495,206 B2    2/2009    Park
7,511,300 B2    3/2009    Lee et al.
(Continued)

FOREIGN PATENT DOCUMENTS

CN    1870284 A    11/2006
CN    101931050 A    12/2010
(Continued)

OTHER PUBLICATIONS

Chinese Office Action dated Jun. 3, 2016, issued in corresponding Chinese Patent Application No. 201210387179.1.

*Primary Examiner* — Ngoc-Yen Vu
(74) *Attorney, Agent, or Firm* — Harness, Dickey & Pierce, P.L.C

(57) ABSTRACT

Provided is an organic pixel, which includes a semiconductor substrate including a pixel circuit, an interconnection layer having a first contact and a first electrode formed on a semiconductor substrate, and an organic photo-diode formed on the interconnection layer. For example, the organic photo-diode includes an insulation layer formed on the first
(Continued)

electrode, a second electrode and a photo-electric conversion region formed between the first contact, the insulation layer and the second electrode. The photo-electric conversion region includes an electron donating organic material and an electron accepting organic material. The organic photo-diode may further include a second contact electrically connected to the first contact. The horizontal distance between the second contacts and the insulation layer may be less than or equal to a few micrometers, for example, 10 micrometers.

19 Claims, 27 Drawing Sheets

(51) Int. Cl.
| | | |
|---|---|---|
| H04N 5/378 | (2011.01) | |
| H01L 51/42 | (2006.01) | |
| H04N 5/369 | (2011.01) | |
| H04N 5/335 | (2011.01) | |
| H04N 5/3745 | (2011.01) | |

(58) Field of Classification Search
USPC ................ 348/294, 308–310; 250/208.1
See application file for complete search history.

(56) References Cited

U.S. PATENT DOCUMENTS

| | | | |
|---|---|---|---|
| 7,648,866 B2 | 1/2010 | Jung et al. | |
| 7,920,189 B2 | 4/2011 | Goto | |
| 8,330,194 B2 | 12/2012 | Sato | |
| 8,368,784 B2 * | 2/2013 | Yamaguchi | ....... H01L 27/14632 |
| | | | 348/272 |
| 8,450,728 B2 * | 5/2013 | Yamaguchi | ....... H01L 27/14603 |
| | | | 257/40 |
| 8,587,040 B2 | 11/2013 | Kobayashi et al. | |
| 8,629,429 B2 * | 1/2014 | Tsutsui | ................ H01L 51/0021 |
| | | | 257/40 |
| 8,692,345 B2 | 4/2014 | Nakazawa et al. | |
| 8,817,149 B2 * | 8/2014 | Goto | .................. H01L 27/14667 |
| | | | 348/294 |
| 2008/0251823 A1 | 10/2008 | Lee | |
| 2010/0190334 A1 | 7/2010 | Lee | |

FOREIGN PATENT DOCUMENTS

| | | |
|---|---|---|
| CN | 101964352 A | 2/2011 |
| JP | 2006191081 A | 7/2006 |
| JP | 2008536330 A | 9/2008 |
| KR | 100610481 B1 | 8/2006 |
| KR | 100782463 B1 | 12/2007 |
| KR | 100889365 B1 | 3/2009 |

\* cited by examiner

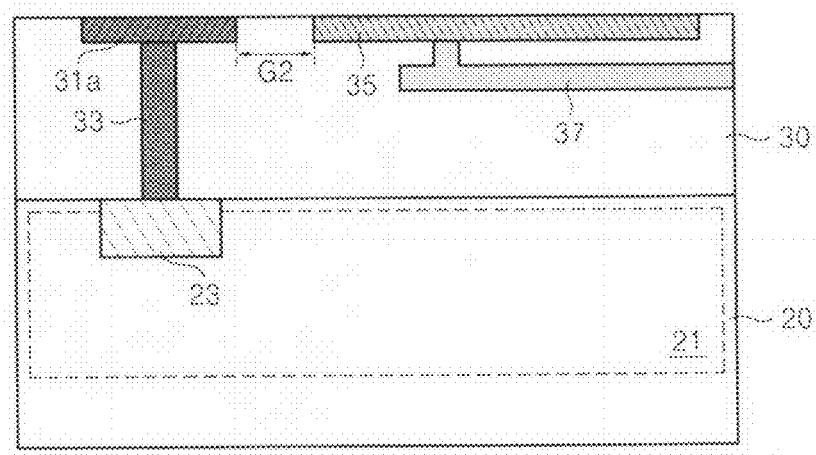

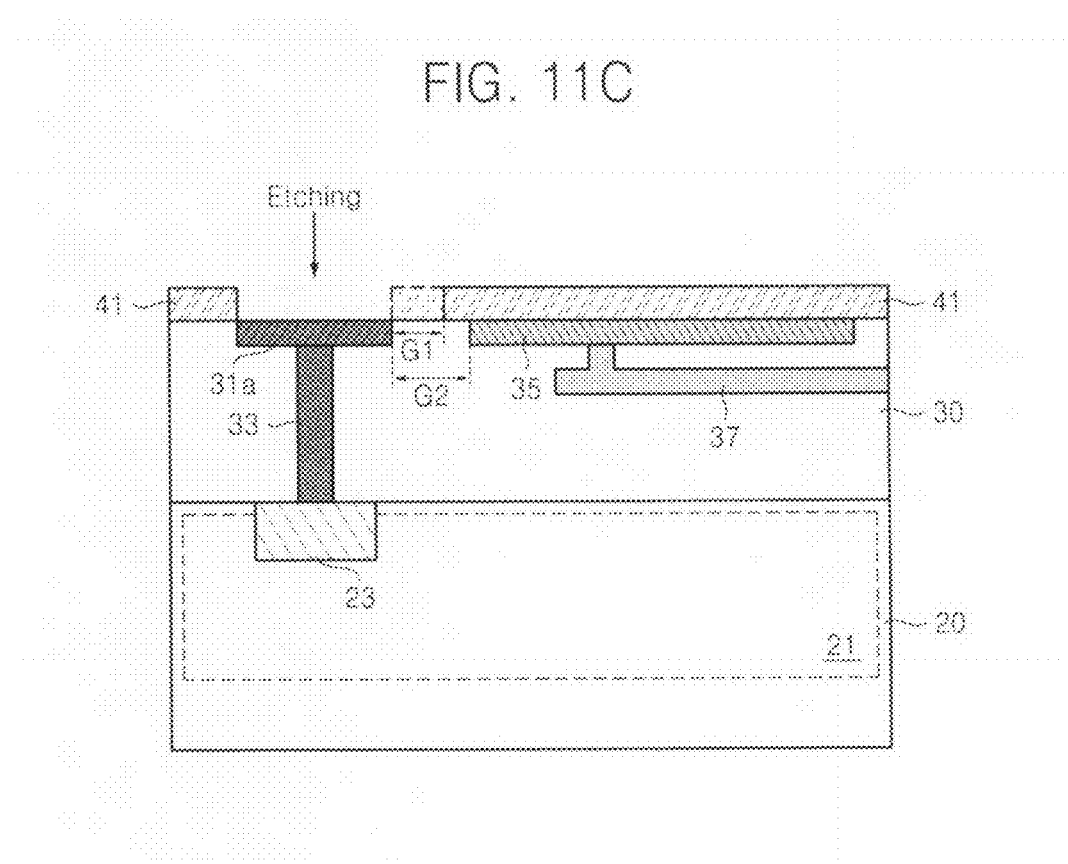

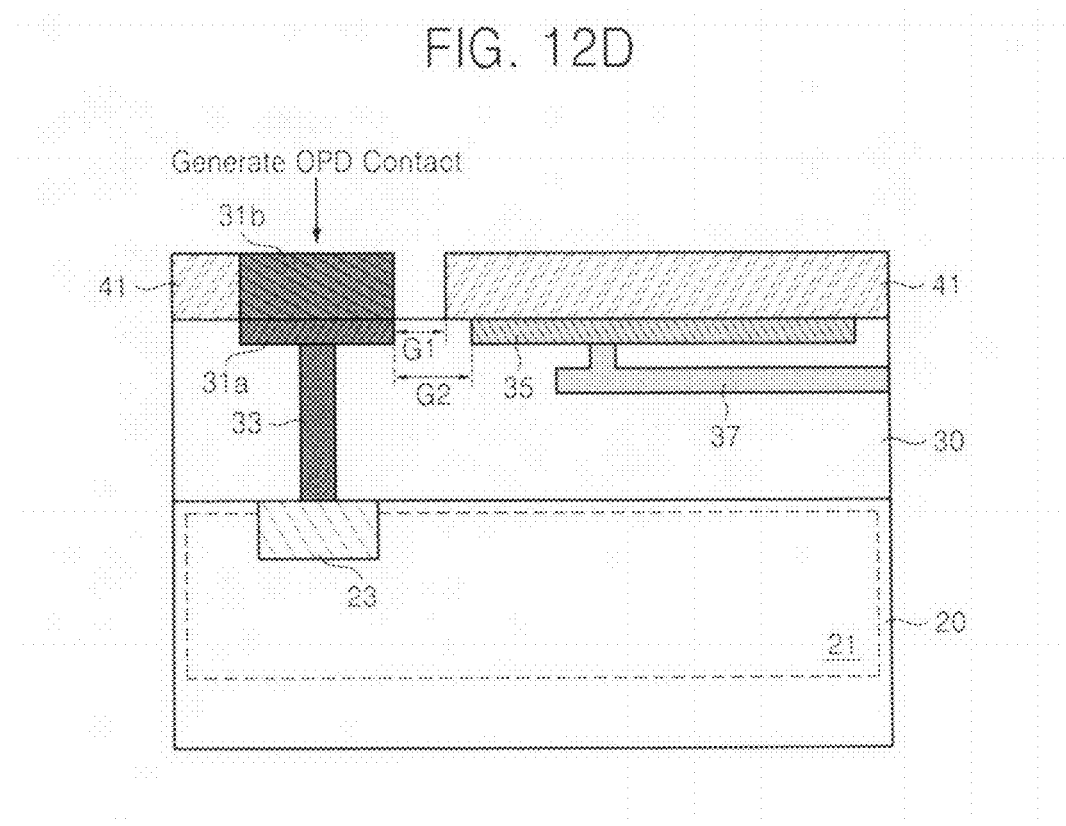

ORGANIC PIXELS INCLUDING ORGANIC PHOTODIODE, MANUFACTURING METHODS THEREOF, AND APPARATUSES INCLUDING THE SAME

CROSS-REFERENCE TO RELATED APPLICATION

This application is a Continuation of U.S. application Ser. No. 13/650,839, filed Oct. 12, 2012, which claims priority under 35 U.S.C. §119(a) to Korean Patent Application No. 10-2011-0105205 filed on Oct. 14, 2011, the entire contents of each of which are incorporated herein by reference.

BACKGROUND

Example embodiments of inventive concepts generally relate to an organic photo-diode, for example, to an organic pixel including an organic photo-diode which may divide and perform a charge accumulation operation and a charge transfer operation in response to a voltage of a transfer control signal, manufacturing and operating methods of the organic pixel, and/or apparatuses including the organic pixel.

A photo-diode is an example of a photo-electric conversion element or a photo-detector which may convert light energy into an electric signal such as a current or a voltage.

A photo-diode may have a P-N junction structure or a PIN structure and generates free electrons and holes by using a photo-electric effect.

A photo-diode is widely used in a CMOS image sensor due to a photo-electric conversion function or a photo detection function. The CMOS image sensor may include an array of a plurality of pixel sensors as an image sensor. The plurality of pixel sensors may be manufactured by a CMOS process and/or a special process related thereto. Each of the plurality of pixel sensors may include a photo-detector such as a photo-diode and may further include an active amplifier.

Pixel signals output from the array are converted to digital signals through various processing procedures, e.g., correlated double sampling (CDS) and analog to digital conversion. The digital signals may be processed by an image signal processor and processed signals may be displayed through a display.

An image quality displayed through the display may be determined according to performance of a pixel sensor including, for instance, a photo-diode. Accordingly, research and development to improve performance of the pixel sensor has been conducted.

SUMMARY

According to example embodiments of inventive concepts, an organic pixel may include an interconnection layer on a semiconductor substrate having a pixel circuit, the interconnection layer having a first contact and a first electrode, and an organic photo-diode on the interconnection layer. The organic photo-diode may include an insulation layer on the first electrode, a second electrode, and a photo-electric conversion region between the first contact, the insulation layer, and the second electrode. The photo-electric conversion region may include an electron donating organic material and an electron accepting organic material.

The first electrode and the photo-electric conversion region may be insulated by the insulation layer.

The organic photo-diode may further include a second contact electrically connected to the first contact. The first electrode and the photo-electric conversion region may be insulated by the insulation layer, and a distance between the second contact and the insulation layer is smaller than or equal to a few micrometer, for example, less than 10 micrometers (µm).

The organic pixel may be a cell in a 4T operation mode.

The interconnection layer may further include a via connecting the first contact with a connection node of the pixel circuit, and a metal line supplying a transfer control signal to the first electrode.

The connection node may be at least one of a floating diffusion node of the pixel circuit and an intermediate storage node connected to the floating diffusion node.

The pixel circuit may further include a switch configured to connect the intermediate storage node and the floating diffusion node in response to a switching signal.

A thickness of the insulation layer is smaller than or equal to a few micrometers. The second electrode may be a transparent electrode such as ITO.

The interconnection layer may further include a via connecting the contact and the pixel circuit and a metal line supplying a transfer control signal to the first electrode.

According to example embodiments of inventive concepts, an image sensor may include an organic pixel as described herein and a row driver configured to output a transfer control signal for controlling a charge transfer operation of the organic pixel.

The organic pixel may include a semiconductor substrate including a pixel circuit, an interconnection layer having a first contact and a first electrode, and an organic photo-diode on the interconnection layer on the semiconductor substrate. The organic photo-diode may include an insulation layer on the first electrode, a second electrode, and a photo-electric conversion region having an electron donating organic material and an electron accepting organic material formed between the first contact, the insulation layer and the second electrode.

The organic photo-diode may further include a second contact electrically connected to the first contact, the first electrode and the photo-electric conversion region are insulated by the insulation layer, and a distance between the second contact and the insulation layer is smaller than or equal to a few micrometers, for example, less than 10 micrometers (µm).

The interconnection layer may further includes a via connecting the first contact and the pixel circuit, and a metal line supplying the transfer control signal to the first electrode. The row driver may supply the transfer control signal having a first level to the metal line during a photo-charge accumulation operation, and may supply the transfer control signal having a second level lower than the first level to the metal line during a photo-charge transfer operation. The via may be connected to a floating diffusion node of the pixel circuit or connected to an intermediate storage node connected to the floating diffusion node of the pixel circuit.

The image sensor may further include a switch. The switch may be configured to connect the intermediate storage node and the floating diffusion node in response to a switching signal output from the row driver.

According to example embodiments of inventive concepts, an image processing device may include an image sensor having an organic pixel as described herein and a row driver outputting a transfer control signal for controlling a charge transfer operation of the organic pixel, The image sensor may further include a second contact electrically connected to the first contact. The first electrode and the photo-electric conversion region may be insulated by the insulation layer, and a distance between the second contact and the insulation layer may be less than or equal to a few micrometers, for example, less than 10 micrometers (μm).

The interconnection layer in the image sensor may further include a via connecting the contact and the pixel circuit and a metal line supplying the transfer control signal to the first electrode. The row driver of the image processing device may supply the transfer control signal having a first level to the metal line during a photo-charge accumulation operation, and supplies the transfer control signal having a second level lower than the first level to the metal line during a photo-charge transfer operation According to example embodiments of inventive concepts, an image processing device may include an image sensor as described herein and a processor configured to control an operation of the image sensor.

The interconnection layer of an organic pixel in the image sensor as describe herein may further include a via connecting the first contact with a connection node of the pixel circuit, and a metal line supplying a transfer control signal to the first electrode. The row driver of the image sensor may supply the transfer control signal having a first level to the metal line during a photo-charge accumulation operation, and may supply the transfer control signal having a second level lower than the first level to the metal line during a photo-charge transfer operation The organic pixel of the image processing device may be a cell in a 4T operation mode.

The image processing device may be, or be embodied in a cellular phone, a smart phone, a tablet PC, a digital camera, or other similar device.

According to example embodiments of inventive concepts, an organic pixel may include a semiconductor substrate including a pixel circuit, a first electrode on the substrate, the first electrode electrically connected to a transfer control signal, a first contact on the substrate, the first contact adjacent to the first electrode and electrically connected to the pixel circuit, and an organic photo-diode on the first electrode. The organic photo-diode may include a photo-electric conversion region, a second electrode on the photo-electric conversion region, and an insulation layer interposed between the first electrode and the photo electric-conversion region and in configured to function as a potential barrier to prevent charges generated in the photo-electric conversion region from being transmitted to the first electrode. The organic pixel may further include a second contact electrically connected to the first contact and a distance between the second contact and the insulation layer is less than or equal to 10 micrometers.

The photoelectric conversion region may include an electron donating organic material and an electron accepting organic material.

The first electrode may be configured to control a photo-charge accumulation operation and a photo-charge transfer operation in response to a transfer control signal.

According to example embodiments of inventive concepts, a manufacturing method of an organic pixel may include forming an interconnection layer having a first contact and a first electrode on a semiconductor substrate, the semiconductor substrate having a pixel circuit, and forming an organic photo-diode including a second electrode on the interconnection layer. Forming the organic photo-diode may include forming an insulation layer on the first electrode and forming a photo-electric conversion region having an electron donating organic material and an electron accepting organic material between the first contact, the insulation layer, and the second electrode.

The manufacturing method may further comprise forming a second contact on the first contact such that the second contact is electrically connected to the first contact. The photo-electric conversion region may be formed between the second contact, the insulation layer, and the second electrode.

Forming the photo-electric conversion region may include forming a first organic layer including the electron donating organic material prior to a second organic layer including the electron accepting organic material.

Forming the photo-electric conversion region may include forming a first organic layer including the electron donating organic material later than a second organic layer including the electron accepting organic material. According to other example embodiments, forming the photo-electric conversion region may include forming an organic material that the electron donating organic material and the electron accepting organic material are mixed.

According to example embodiments, a manufacturing method of an image sensor may include forming an organic pixel using the foregoing organic pixel manufacturing method.

According to example embodiments, an operation method of an organic pixel including an organic photo-diode having an insulation layer and an electron donating organic material and an electron accepting organic material may include receiving a transfer control signal via the electrode of the organic pixel, and performing a charge accumulation operation, which accumulates photo-charges near the insulation layer formed on the electrode, and a charge transfer operation, which transfers the accumulated photo-charges to a pixel circuit through the a contact separated from the electrode, according to a voltage of the transfer control signal.

The charge accumulation operation may be performed when the voltage has a first level, and the charge transfer operation may be performed when the voltage has a second level lower than the first level.

The electron donating organic material and the electron accepting organic material may form a hetero p-n junction.

BRIEF DESCRIPTION OF THE DRAWINGS

Example embodiments will be more clearly understood from the following brief description taken in conjunction with the accompanying drawings. FIGS. 1-12 represent non-limiting, example embodiments as described herein.

FIG. 1 is a cross-sectional diagram of an organic pixel including an organic photo-diode according to example embodiments of inventive concepts;

FIG. 2 is an example embodiment of a circuit diagram of an organic pixel including the organic photo-diode and a pixel circuit illustrated in FIG. 1;

FIG. 3 is another example embodiment of the circuit diagram of the organic pixel including the organic photo-diode and the pixel circuit illustrated in FIG. 1;

FIG. 4 is still another example embodiment of the circuit diagram of the organic pixel including the organic photo-diode and the pixel circuit illustrated in FIG. 1;

FIG. 5 illustrates an example photo-charge accumulation operation and an example photo-charge transfer operation for explaining an operation of the organic pixel illustrated in FIG. 1;

FIG. 6 illustrates energy band diagrams corresponding to the photo-charge accumulation operation and the photo-charge transfer operation of the organic pixel illustrated in FIG. 5;

FIG. 7 is an example flowchart illustrating an operation of the organic pixel illustrated in FIG. 5;

FIG. 8 is a block diagram illustrating an example embodiment of an image processing device including the organic pixel illustrated in FIG. 1;

FIG. 9 is a block diagram depicting another example embodiment of the image processing device including the organic pixel illustrated in FIG. 1;

FIGS. 10A to 10E illustrate example embodiments of a manufacturing process of the organic pixel illustrated in FIG. 1;

FIGS. 11A to 11F illustrates example embodiments of a manufacturing process of the organic pixel illustrated in FIG. 1; and FIGS. 12A to 12G illustrates other example embodiments of the manufacturing process of the organic pixel illustrated in FIG. 1.

Figure 1:
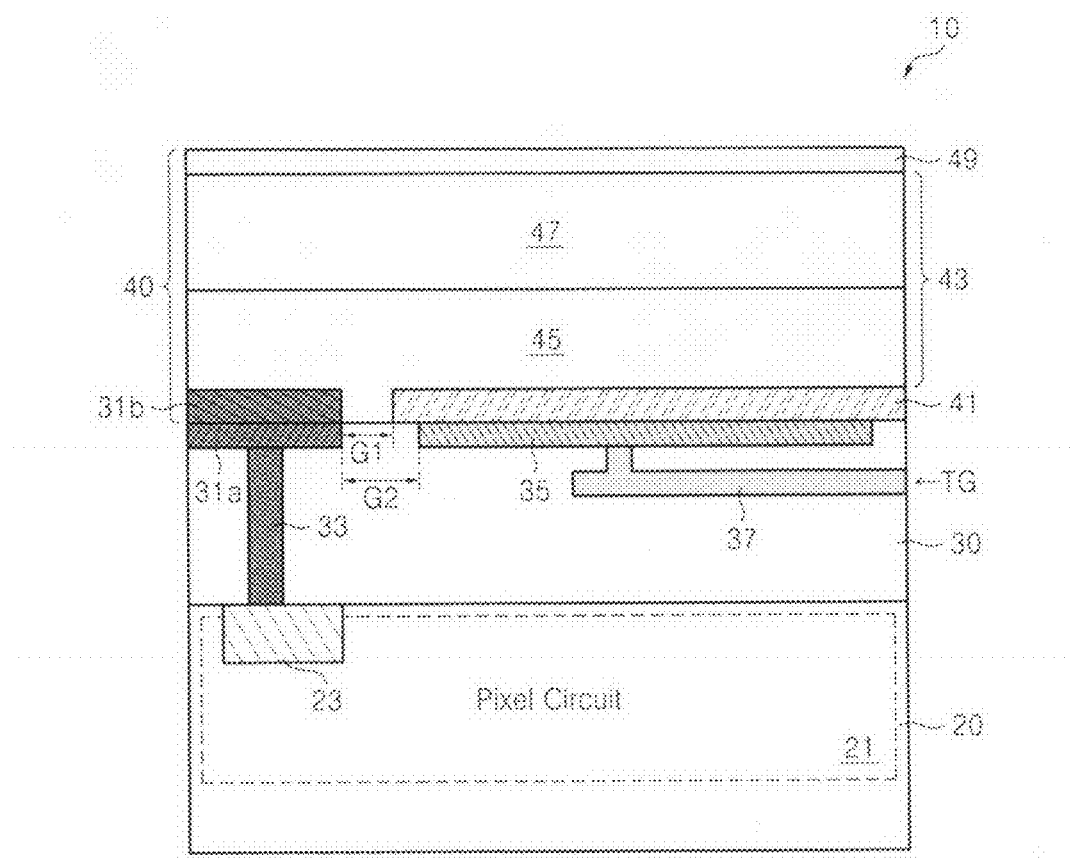

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments now will be described more fully hereinafter with reference to the accompanying drawings, in which example embodiments are shown. Example embodiments may, however, be embodied in many different forms and should not be construed as limited to the embodiments set forth herein. Rather, these example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, signal, layer or section discussed below could be termed a second element, component, region, signal, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises" and/or "comprising," or "includes" and/or "including," if used herein, specify the presence of stated features, regions, integers, steps, operations, elements, and/or components, but do not preclude the presence or addition of one or more other features, regions, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a cross-sectional view of an organic pixel including an organic photo-diode according to example embodiments of inventive concepts. Referring to FIG. 1, an active organic pixel sensor 10 (hereinafter, "organic pixel") may include a semiconductor substrate 20 having a pixel circuit 21 (or a pixel circuit region), an interconnection layer 30 formed on the semiconductor substrate 20, and an organic photo-diode 40 formed on the interconnection layer 30.

Pixel circuits 21, 21A, 21B and 21C including transistors will be explained referring to FIGS. 2, 3 and 4.

Photo-charges (or photo-electrons) output from the organic photo-diode 40 may be transferred to the pixel circuit 21 of the semiconductor substrate 20 through the interconnection layer 30. In addition, a transfer control signal TG which may control a charge accumulation operation and a charge transfer operation of the organic photo-diode 40 may be supplied to a first electrode 35 through a metal line 37 of the interconnection layer 30.

The interconnection layer 30 connecting the semiconductor substrate 20 and the organic photo-diode 40 may include a first contact 31a, a via 33, the first electrode 35 and the metal line 37.

The interconnection layer 30 may be a dielectric material except for each component 31a, 33, 35 and 37. Accordingly, the interconnection layer 30 may also be referred to as "a dielectric layer".

The first contact 31a may be electrically connected to a connection node 23 which is embodied in the pixel circuit 21 through the via 33. The via 33 is an example of vertical electrical connection.

The first electrode 35 may receive the transfer control signal TG input through the metal line 37.

The organic photo-diode 40 may be formed on the first electrode 35 and includes an insulation layer 41 functioning as a potential barrier, a second electrode 49, and a photo-electric conversion region 43. For example, the insulation layer 41 may electrically insulate the photo-electric conversion region 43 from the first electrode 35, thereby preventing charges generated in the photo-electric conversion region 43 from being transmitted to the first electrode 35.

Thickness of the insulation layer 41 may be 10 micrometers (μm) or less. The insulation layer 41 may be the same material as the dielectric material of the interconnection layer 30 or a different material.

The second electrode 49 may be a transparent electrode. For example, the second electrode 49 may be an electrode made of indium tin oxide (ITO) or tin-doped indium oxide.

The photo-electric conversion region 43 may include an electron donating organic material and an electron accepting organic material.

When a first organic layer 45 is formed of a layer including one of the electron donating organic material and the electron accepting organic material, a second organic layer 47 may be formed of a layer including one of the other electron accepting organic material and the other electron donating organic material. For example, when the first organic layer 45 is a n-type organic material, the second organic layer 47 may be a p-type organic material.

Accordingly, the first organic layer 45 and the second organic layer 47 may form a hetero p-n junction. The electron donating organic material may be a material which generates a donor ion in response to light and the electron accepting organic material may be a material which generates an acceptor ion in response to the light.

According to example embodiments, the photo-electric conversion region 43 may be an organic material that the electron donating organic material and the electron accepting organic material are mixed.

A horizontal distance G1 between the first contact 31a and the insulation layer 41 may be shorter than a horizontal distance G2 between the first contact 31a and the first electrode 35. According to example embodiments, a second contact 31b electrically connected to the first contact 31a may be formed on the first contact 31a to increase a photo-charge transfer speed during a photo-charge transfer operation. According to example embodiments, the horizontal distance G1 between each contact 31a or 31b and the insulation layer 41 may be less than or equal to 10 micrometers (μm).

Figure 2:
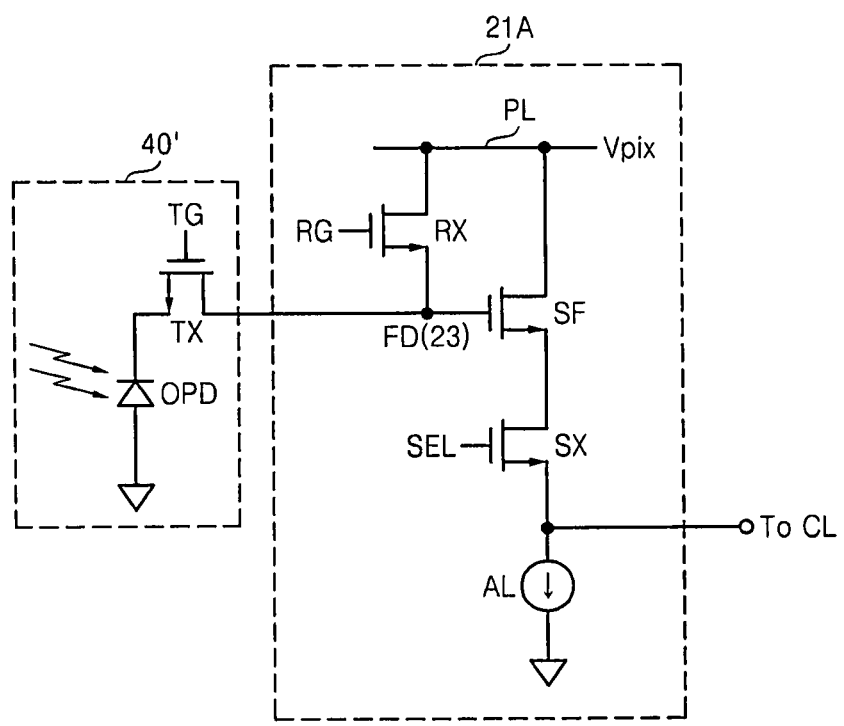

FIG. 2 is an example embodiment of a circuit diagram of an organic pixel including the organic photo-diode and a pixel circuit illustrated in FIG. 1. An organic pixel illustrated in FIG. 2 may be referred to as a cell in a 4T operation mode or a 4-transistor active pixel sensor. A cell in the 4T operation mode refers to a concept including four transistors, TX, RX, SF and SX.

Referring to FIG. 2, an organic photo-diode 40' may include an organic photo-diode OPD and a control element, e.g., a transfer transistor TX, which may control a photo-charge accumulation operation and a photo-charge transfer operation according to a transfer control signal TG. For example, the first electrode 35 may function as a gate of the transfer transistor TX.

The pixel circuit 21A of FIG. 2 corresponding to the pixel circuit 21 illustrated in FIG. 1 may include a reset transistor RX, a drive transistor SF, a selection transistor SX and/or a bias circuit AL.

A floating diffusion node FD may function as the connection node 23. Accordingly, the floating diffusion node FD may be connected to the via 33.

The reset transistor RX may be connected between a power line PL supplying an operation voltage Vpix and the floating diffusion node FD and may reset the floating diffusion node FD in response to a reset signal RG. During a reset operation, the operation voltage Vpix may be supplied to the connection node 23.

The drive transistor SF functioning as a read-out transistor operates in response to a voltage of the floating diffusion node FD and may function as a source follower.

The selection transistor SX operating in response to a selection signal SEL may transmit a pixel signal output through the drive transistor SF to a column line CL. The bias circuit AL may function as an active load and may provide the pixel circuit 21A with a bias current.

Figure 3:
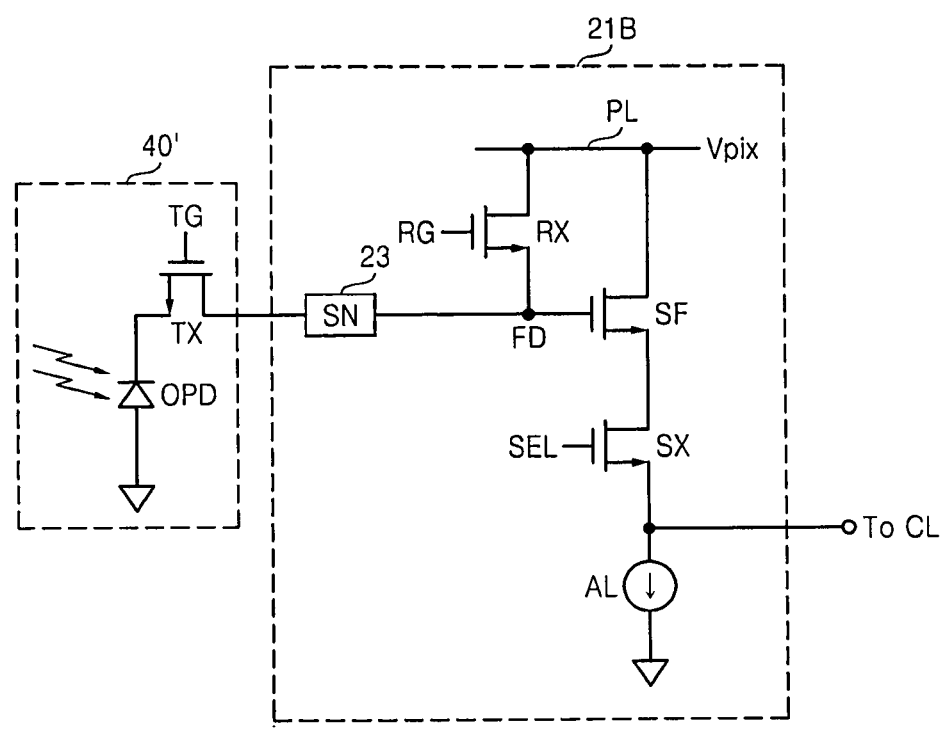

FIG. 3 is another example embodiment of the circuit diagram of the organic pixel including the organic photo-diode and the pixel circuit illustrated in FIG. 1. The organic pixel illustrated in FIG. 3 is a cell in a 4T operation mode, which is similar to the organic pixel illustrated in FIG. 1, but further includes the connection node 23, e.g., an intermediate storage node SN, between the floating transistor TX and the floating diffusion node FD.

Referring to FIGS. 1 and 3, a pixel circuit 21B may include the intermediate storage node SN functioning as the connection node 23 and the intermediate storage node SN may be connected to both the floating diffusion node FD and the via 33. For example, the intermediate storage node SN may function as a potential barrier. Accordingly, a voltage of the intermediate storage node SN may be fixed to a constant voltage, e.g., 0V.

Figure 4:
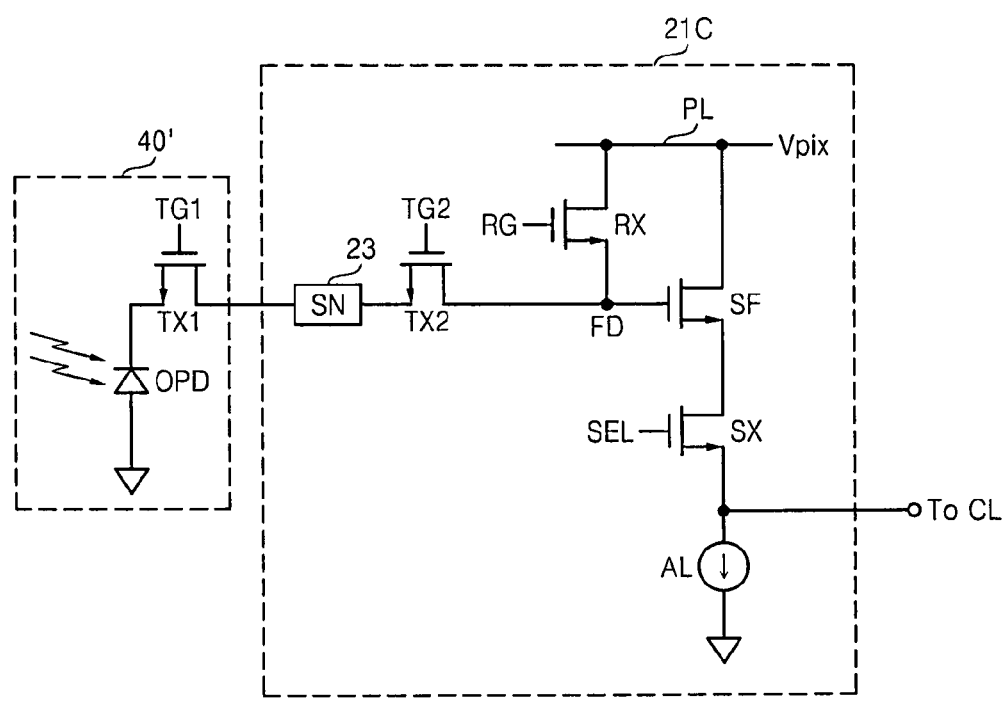

FIG. 4 is still another example embodiment of the circuit diagram of the organic pixel including the organic photo-diode and the pixel circuit illustrated in FIG. 1. Referring to FIGS. 1 and 4, a pixel circuit 21C may include a switch TX2 connected between the connection node 23 and the floating diffusion node FD. The intermediate storage node SN may function as the connection node 23 and as a potential barrier. Accordingly, a voltage of the intermediate storage node SN may be fixed to a constant voltage, e.g., 0V. The intermediate storage node SN may be connected to the via 33. According to example embodiments, a pixel circuit 21B or 21C may include a potential barrier, instead of the intermediate storage node SN, which is irrelevant to an operation of a row driver (130 of FIG. 8).

Figure 5:
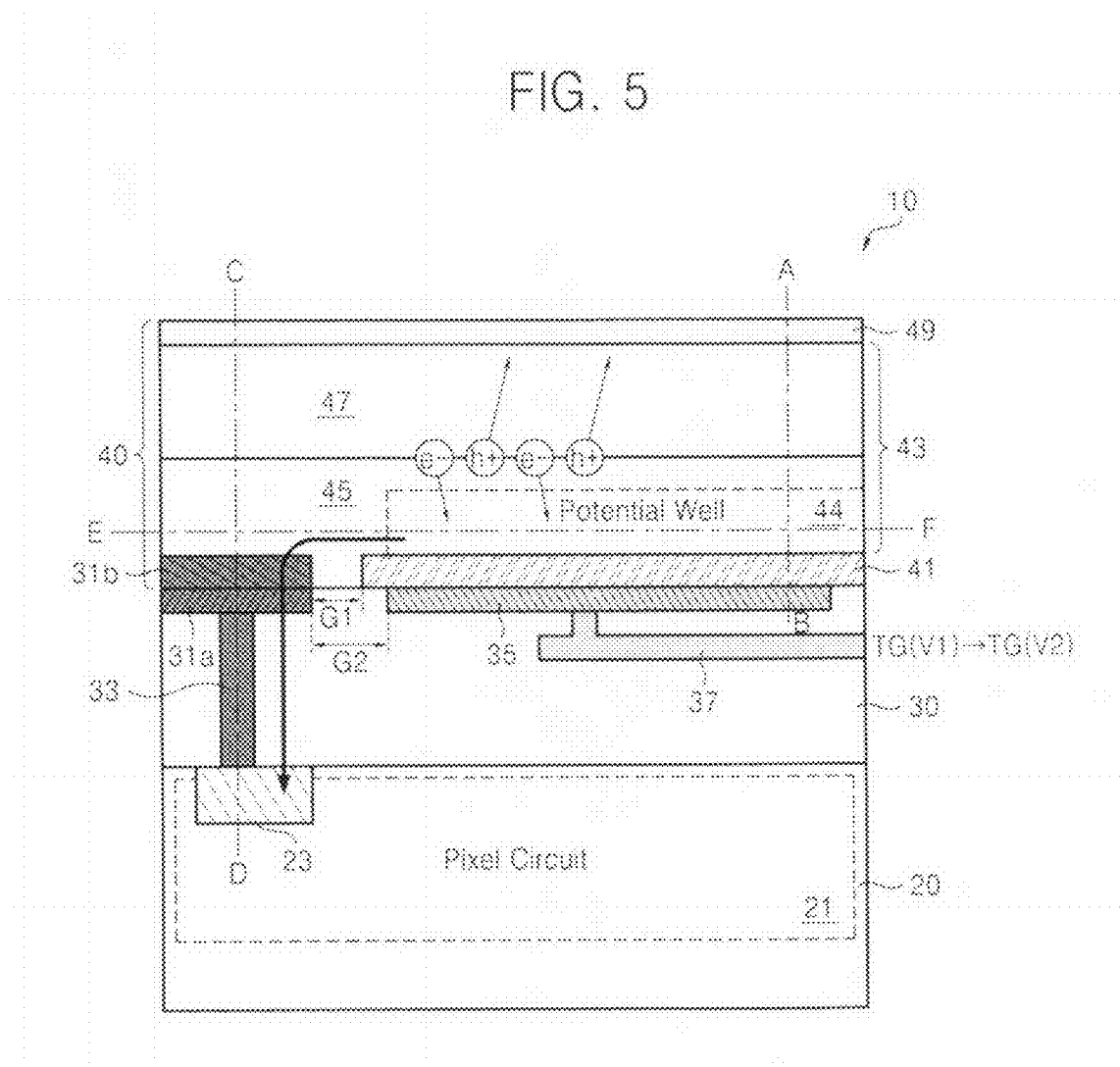
Figure 6:
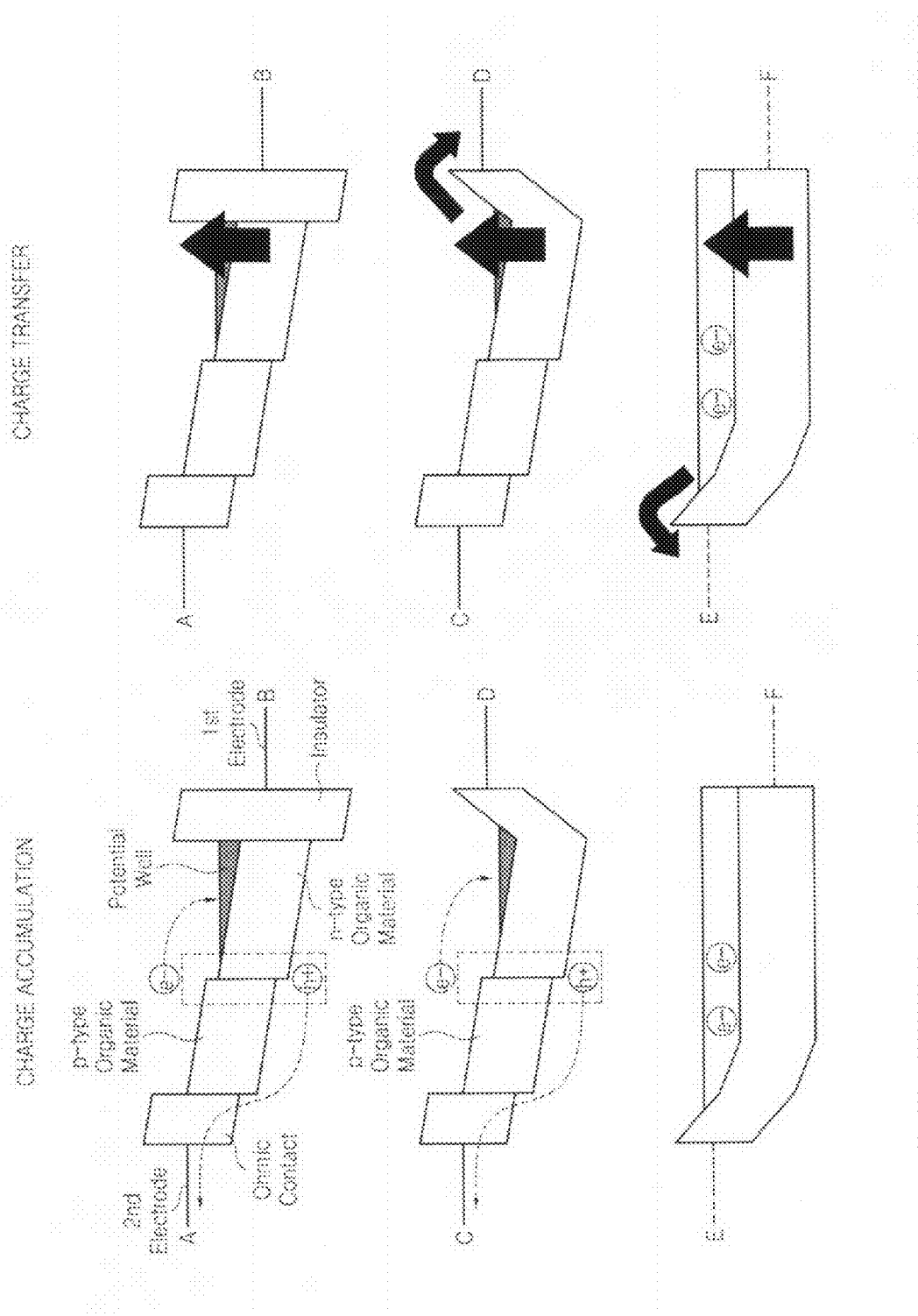
Figure 7:
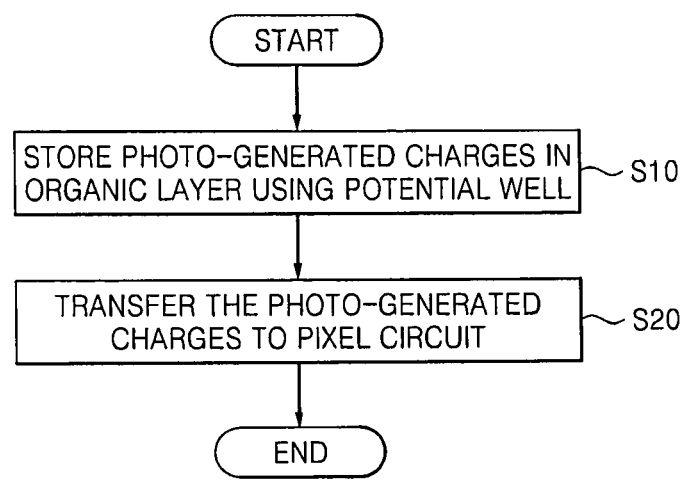

FIG. 5 illustrates an example photo-charge accumulation operation and an example photo-charge transfer operation of the organic pixel illustrated in FIG. 1. FIG. 6 illustrates energy band diagrams corresponding to the photo-charge accumulation operation and the photo-charge transfer operation of the organic pixel illustrated in FIG. 5. FIG. 7 is a flowchart illustrating an operation of the organic pixel illustrated in FIG. 5.

A first organic layer 45 may be a n-type organic material, a second organic layer 47 may be a p-type organic material. The energy band diagrams (e.g., Ohmic Contact) illustrate energy band diagrams between the second electrode 49 and the insulation layer 41.

Referring to FIGS. 5 to 7, when the transfer control signal TG having a first level V1 is supplied to the first electrode 35 through the metal line 37, and a ground voltage, e.g., 0V, or a negative voltage lower than the ground voltage is supplied to the second electrode 49, a potential well 44 where a plurality of photo-generated charges, e.g., free electrons, are accumulated may be formed on the insulation layer 41 and a plurality of holes may be moved towards the second electrode 49 (S10).

For example, charge accumulation operation CHARGE ACCUMULATION using the potential well 44 may be performed in the organic photo-diode 40 due to an energy band configuration as illustrated in the left side of FIG. 6.

When a transfer control signal TG having a second level V2 lower than the first level V1 is supplied to the first electrode 35 through the metal line 37, and the ground voltage, e.g., 0V, or the negative voltage lower than the ground voltage is supplied to the second electrode 49, a plurality of photo-generated charges, e.g., a plurality of free electrons, accumulated in the potential well 44 may be supplied to at least one of contacts 31a and 31b, the via 33 of the interconnection layer 30 and the connection node 23, e.g., the floating diffusion node FD or the intermediate storage node SN (S20).

For example, charge transfer operation CHARGE TRANSFER may be performed in the organic photo-diode 40 due to an energy band configuration as illustrated in the right side of FIG. 6.

As described above, the organic pixel 10 of example embodiments may separately perform a charge accumulation operation CHARGE ACCUMULATION and a charge transfer operation CHARGE TRANSFER in response to a voltage level of the transfer control signal TG supplied to the first electrode 35.

Figure 8:
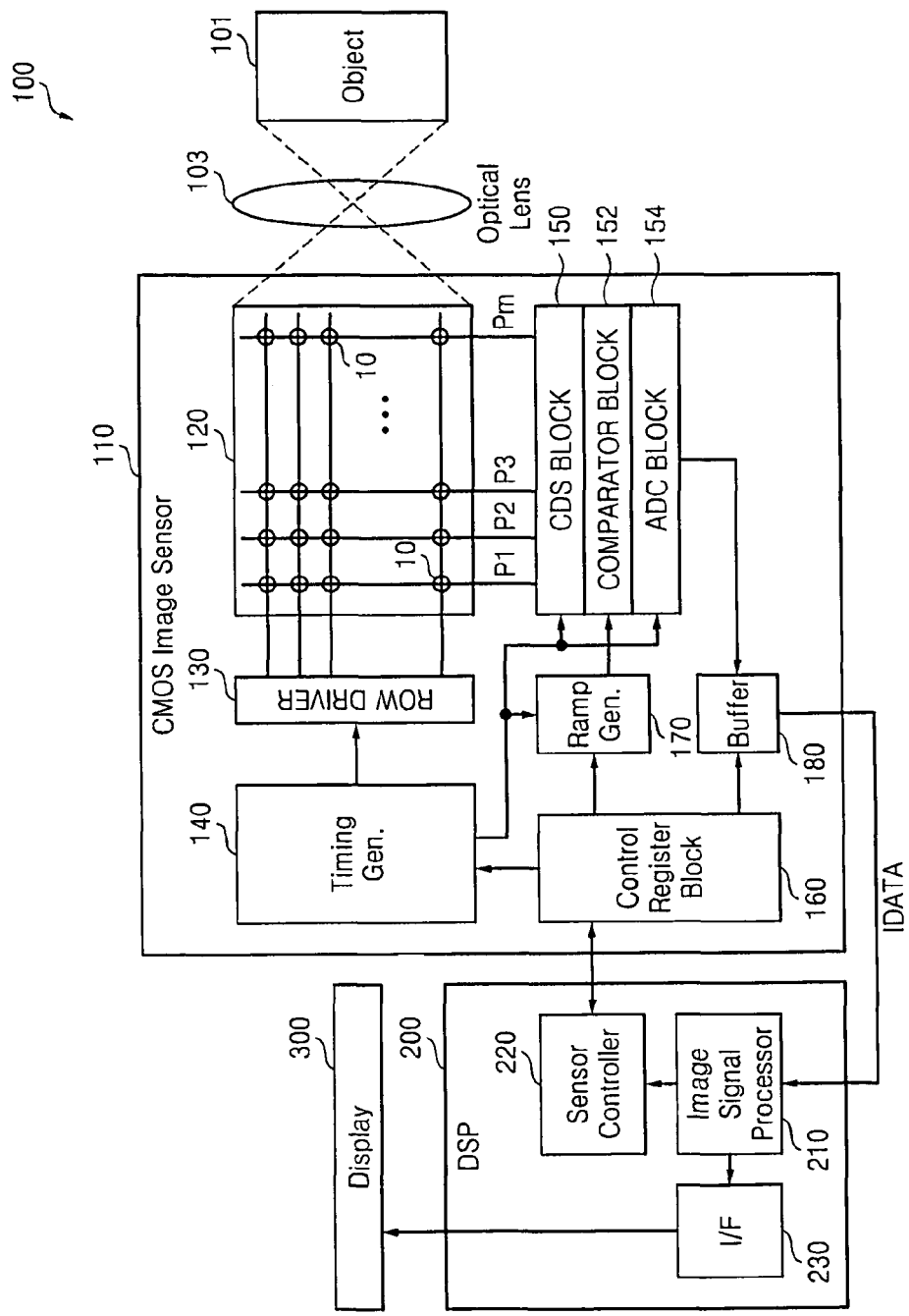

FIG. 8 is a block diagram illustrating example embodiments of an image processing device including the organic pixel illustrated in FIG. 1. Referring to FIGS. 1 and 8, the image processing device 100 may be a portable device, e.g., a digital camera, a cellular phone, a smart phone or a tablet personal computer (PC), or other similar device.

The image processing device 100 may include an optical lens 103, an image sensor 110, a digital signal processor 200 and/or a display 300.

The image sensor 110 may generate image data IDATA for an object 101 photographed or captured through the optical lens 103. For example, the image sensor 110 may be a CMOS image sensor. The image sensor 110 may include a pixel array 120, a row driver 130, a timing generator 140, a correlated double sampling (CDS) block 150, a comparison block 152, an analog to digital conversion block 154, a control register block 160, a ramp signal generator 170, and a buffer 180.

The pixel array 120 may include a plurality of organic pixels 10 arranged in a form of matrix. Structure and operation of each of the plurality of organic pixels 10 are explained above referring to FIGS. 1 to 6.

The row driver 130 may drive a plurality of control signals TG, RG, SEL or TG2 for controlling operation of each of the plurality of organic pixels 10 in the pixel array 120 based on the control of the timing generator 140. The timing generator 140 may control an operation of the row driver 130, the CDS block 150, the analog to digital conversion block 154 and the ramp signal generator 170 based on the control of the control register block 160.

The CDS block 150 may perform correlated double sampling on each pixel signal (P1 to Pm: m is a natural number) output from each of a plurality of column lines embodied in the pixel array 120. The comparison block 152 may compare each of a plurality of correlated double sampled pixel signals output from the CDS block 150 with a ramp signal output from the ramp signal generator 170 and may output a plurality of comparison signals.

The analog to digital conversion block 154 may convert each of the plurality of comparison signals output from the comparison block 152 into an each of a plurality of digital signal and may output the plurality of digital signals to the buffer 180. The control register block 160 may control an operation of the timing generator 140, the ramp signal generator 170, and the buffer 180 based on a control of a digital signal processor 200.

The buffer 180 may transfer the image data IDATA corresponding to a plurality of digital signals output from the analog to digital conversion block 154 to the digital signal processor 200.

The digital signal processor 200 may include an image signal processor 210, a sensor controller 220, and an interface 230.

The image signal processor 210 may control the sensor controller 220, which may control the control register block 160, and the interface 210. According to example embodiments, the image sensor 110 and the digital signal processor 200 may be embodied in a single package, e.g., a multi-chip package. According to another example embodiment, the image sensor 110 and the image signal processor 210 may be embodied in different packages.

The image signal processor 210 may process image data IDATA transmitted from the buffer 180 and may transmit processed image data to the interface 230. The sensor controller 220 may generate various control signals for controlling the control register block 160 based on the control of the image signal processor 210.

The interface 230 may transmit image data processed in the image signal processor 210 to a display 300. The display 300 may display image data output from the interface 230. The display 300 may be a thin film transistor-liquid crystal display (FTF-LCD), a light emitting diode (LED) display, an organic LED (OLED) display, or an active-matrix OLED (AMOLED) display.

Figure 9:
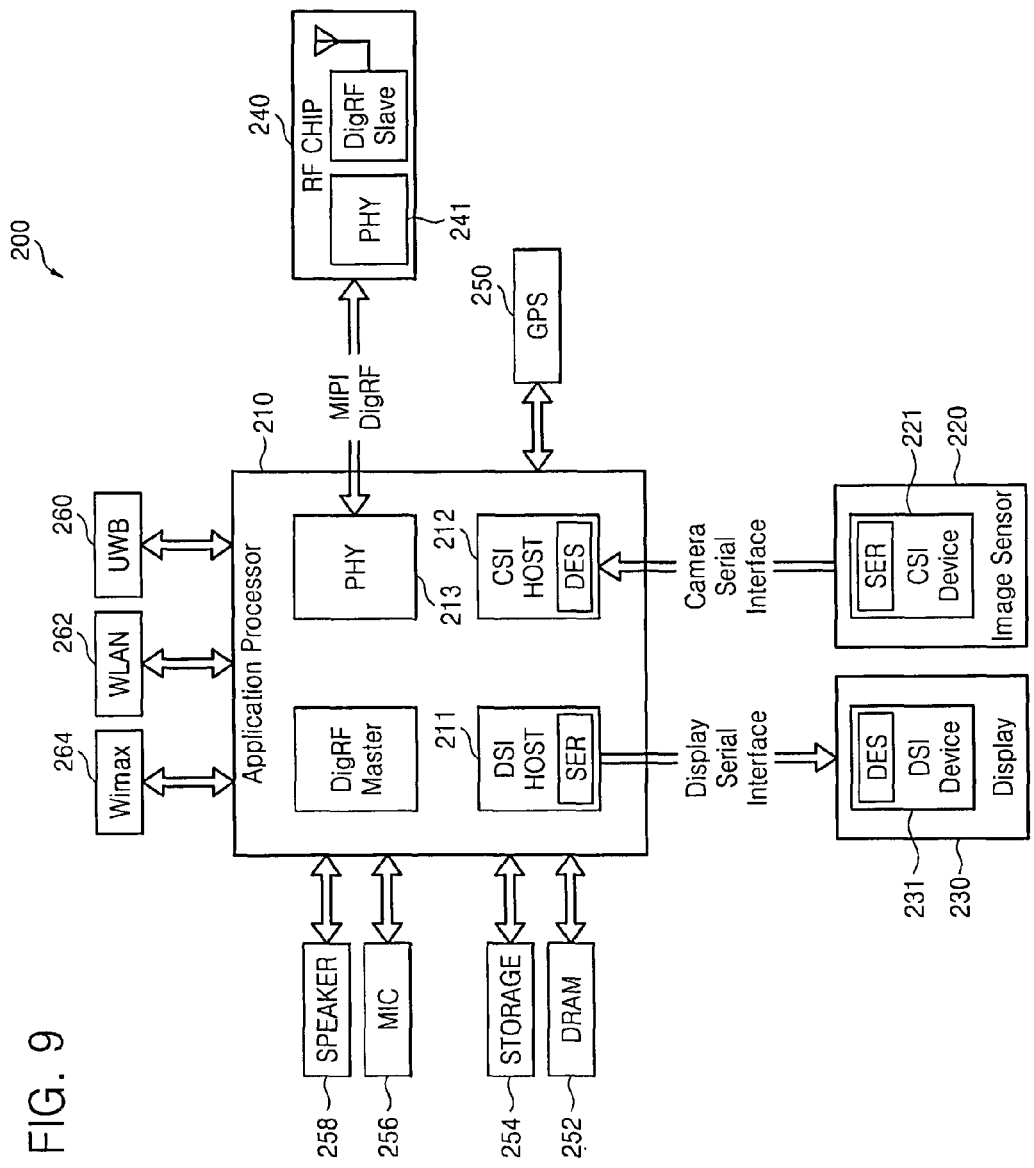

FIG. 9 is another block diagram illustrating example embodiments of the image processing device including the organic pixel illustrated in FIG. 1. Referring to FIG. 9, an image processing device 200 may be an image processing device which may use a mobile industry processor interface (MIPI®), e.g., a portable device such as a personal digital assistant (PDA), a portable media player (PMP), a cellular phone, and a smart phone or a tablet computer.

The image processing device 200 may include an application processor 210, an image sensor 220, and/or a display 230. A camera serial interface (CSI) host 212 included in the application processor 210 may perform a serial communication with a CSI device 221 of the image sensor 220 through a camera serial interface (CSI). According to example embodiments, a de-serializer DES may be included in the CSI host 212 and a serializer SER may be included in the CSI device 221.

The image sensor 220 may refer to an image sensor including the organic pixel 10, as explained above referring to FIG. 1. For example, the image sensor 220 may include an image sensor 110 illustrated in FIG. 8.

A display serial interface (DSI) host 211 included in the application processor 210 may perform a serial communication with a DSI device 231 of the display 230 through a display serial interface. According to example embodiments, a serializer SER may be included in the DSI host 211 and a de-serializer DES may be embodied in the DSI device 231.

The image processing device 200 may further include a RF chip 240 which may communicate with the application processor 210. A PHY 213 of the image processing device 200 and a PHY 241 of the RF chip 240 may transmit and receive data according to MIPI DigRF. The image processing device 200 may include a GPS receiver 250, a memory 252 like a dynamic random access memory (DRAM), a data storage device 254 embodied in a non-volatile memory like a NAND flash memory, a microphone 256 or a speaker 258.

In addition, the image processing device 200 may communicate with an external device by using at least a communication protocol (or a communication standard), e.g., ultra-wideband (UWB) 260, Wireless LAN (WLAN) 262, worldwide interoperability for microwave access (WiMAX) 264 or long term evolution (LTE™).

FIGS. 10A to 10E illustrate example embodiments of a manufacturing process of the organic pixel illustrated in FIG. 1. A manufacturing process of the organic pixel 10 that does not include forming a second contact 31b is explained in detail referring to FIGS. 1 and 10A to 10E.

The pixel circuit 21 including the connection node 23, e.g., a floating diffusion node FD or an intermediate storage node SN may be formed inside and/or outside the semiconductor substrate 20. The interconnection layer 30 including the via 33, the first contact 31a, the metal line 37 and the first electrode 35 may be formed on the semiconductor substrate 20 (FIG. 10A)

Figure 10B:
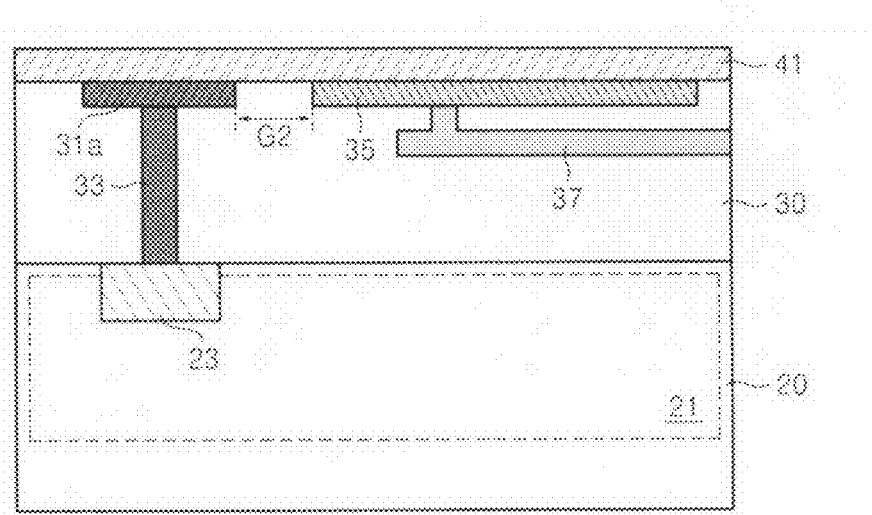
Figure 10C:
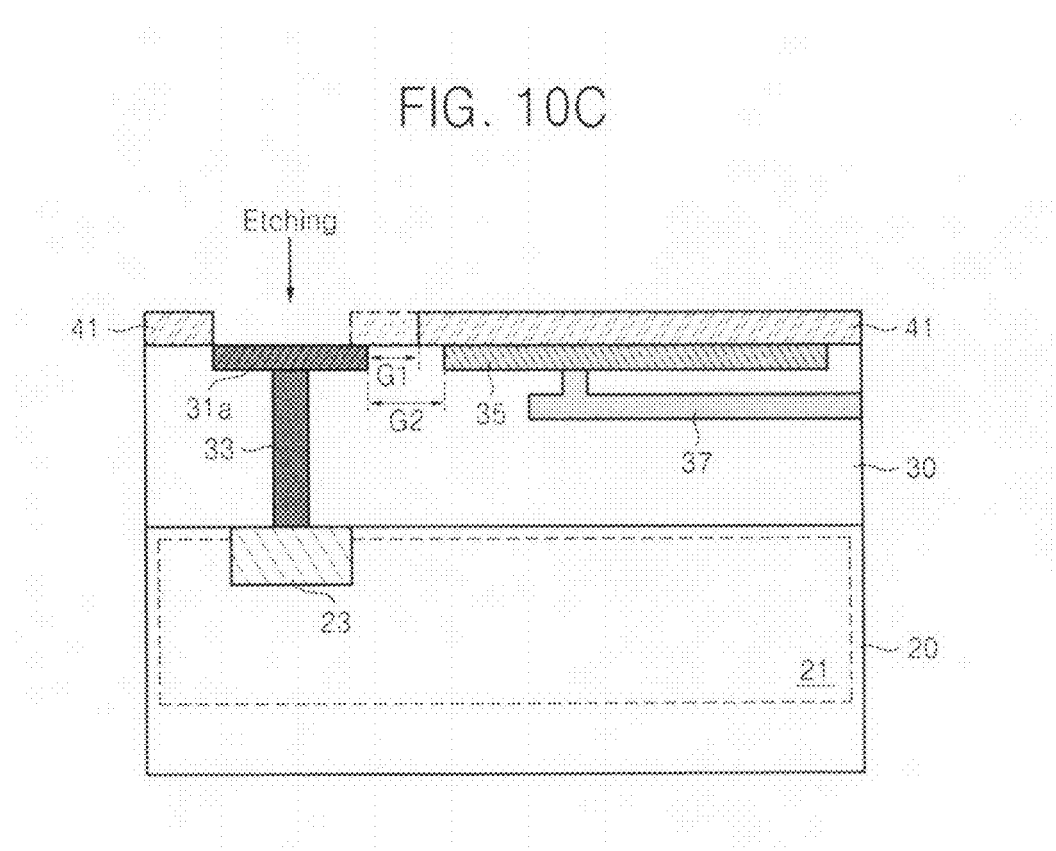
Figure 10D:
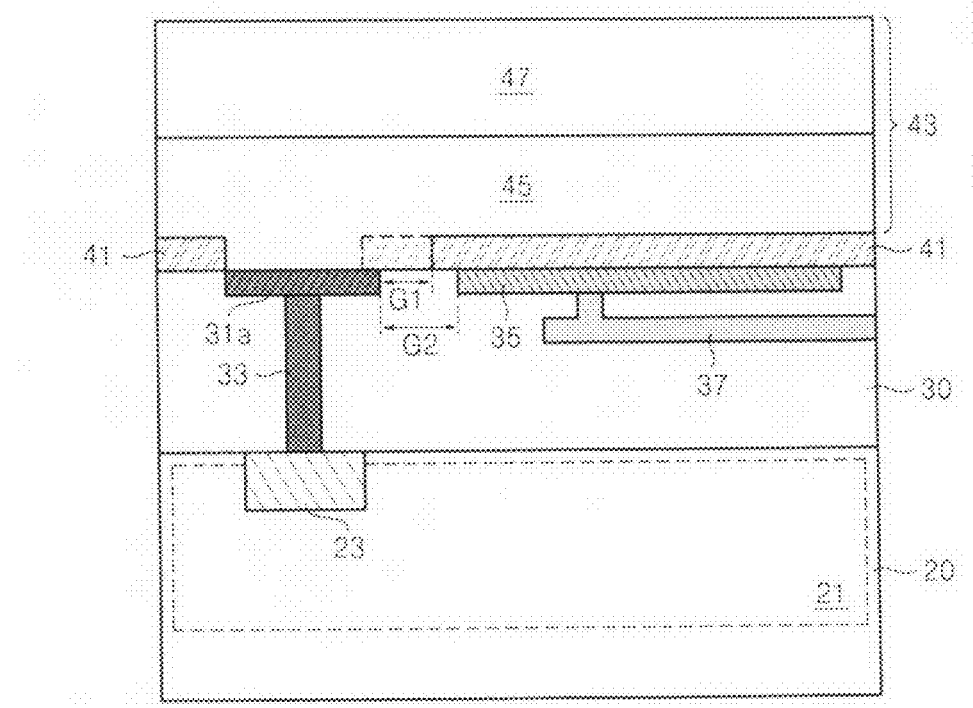

The insulation layer 41 may be formed on the interconnection layer 30 (FIG. 10B). Here, the insulation layer 41 may be a dielectric layer. The insulation layer 41 may be etched so that at least a part of the first contact 31a may be exposed (FIG. 10C).

According to example embodiments, the insulation layer 41 may be selectively etched to form a gap G1 between the first contact 31a and the insulation layer 41. According to example embodiments, the insulation layer 41 may be etched such that a part of the first contact 31a is exposed. The gap G1 may be less than or equal to 10 micrometers (μm).

Figure 10E:
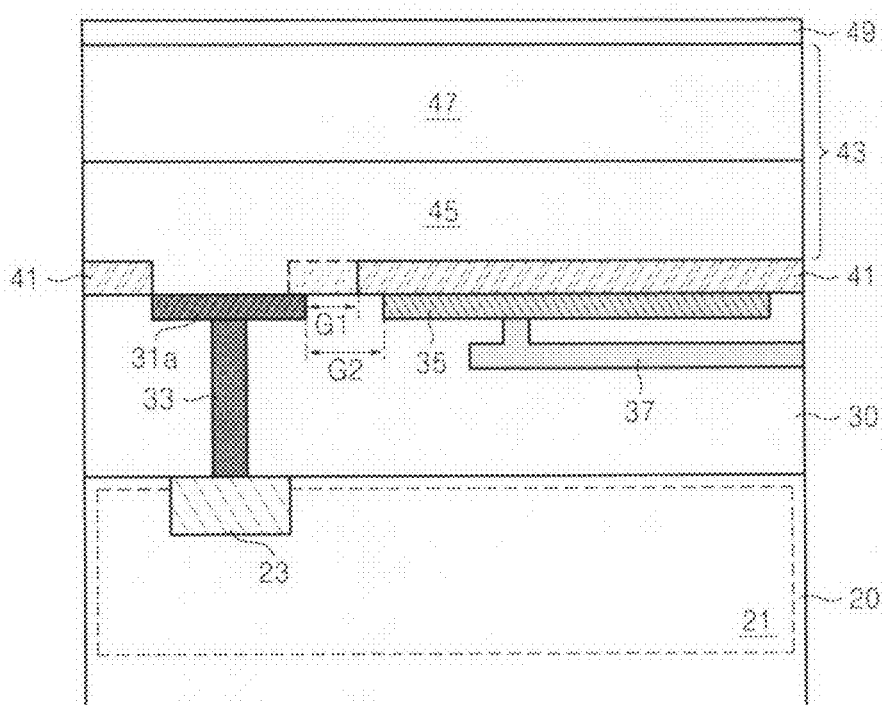

A first organic layer 45 may be formed on each of the first contact 31a, the gap G1 and the insulation layer 41, and a second organic layer 47 may be formed on the first organic layer 45 (FIG. 10D) Accordingly, a photo-electric conversion region 43 including an organic material is formed. The first organic layer 45 may be formed on each of the first contact 31a and the insulation layer 41 when the gap G1 is 0, e.g., when the gap G1 is not formed. A second electrode 49, e.g., a transparent electrode, may be formed on the second organic layer 47 (FIG. 10E).

FIGS. 11A to 11F illustrate example embodiments of a manufacturing process of the organic pixel illustrated in FIG. 1. A manufacturing process of the organic pixel 10 that include forming a second contact 31b is explained in detail referring to FIGS. 1 and 11A to 11F.

Figure 11A:
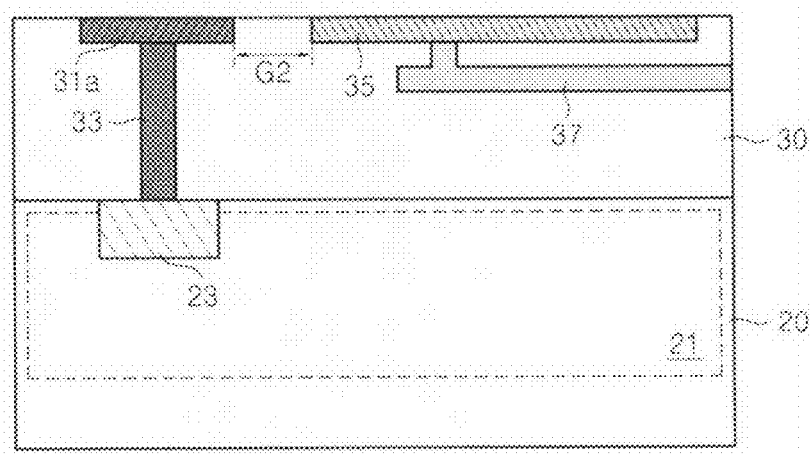
Figure 11B:
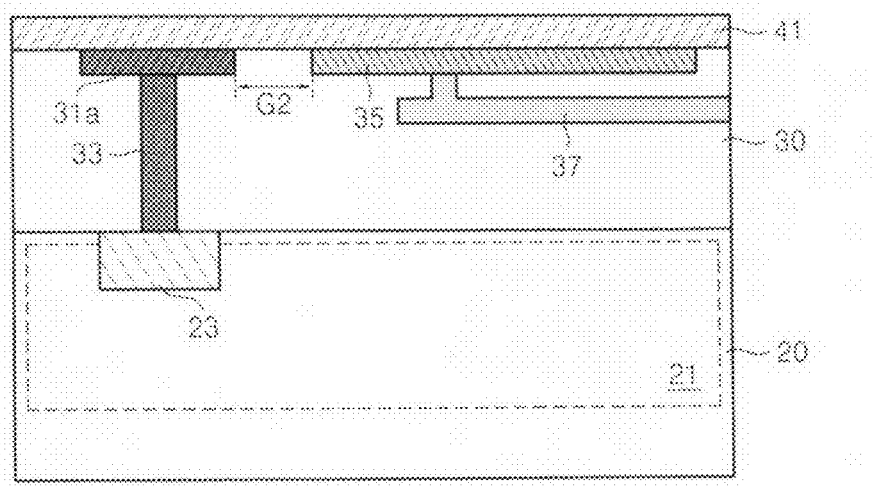

The manufacturing process illustrated in FIGS. 11A to 11C is the same as the manufacturing process illustrated in FIGS. 10A to 10C. Thus, the description thereof will be omitted.

Figure 11D:
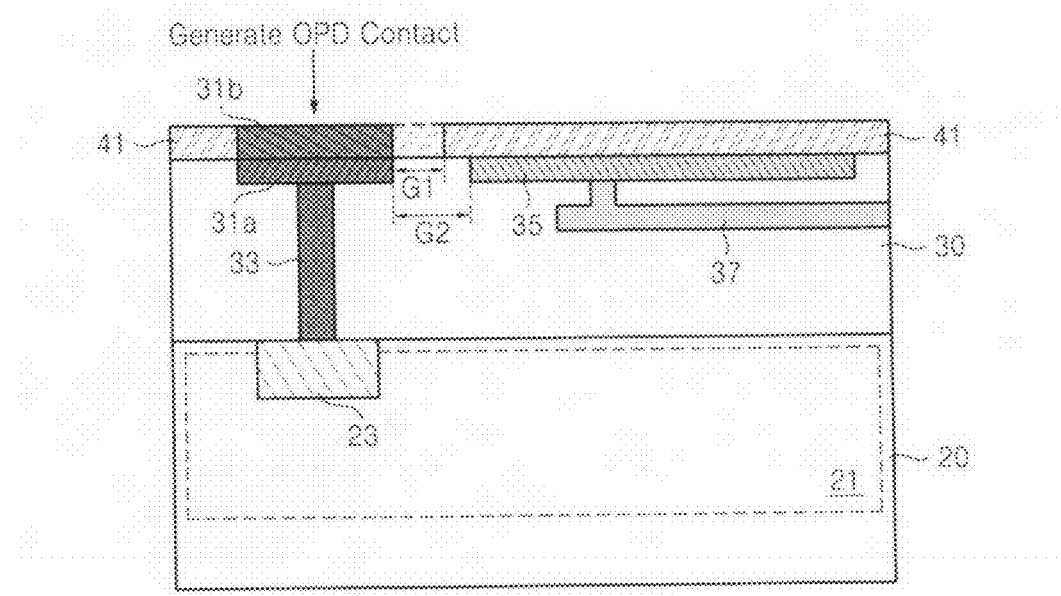
Figure 11E:
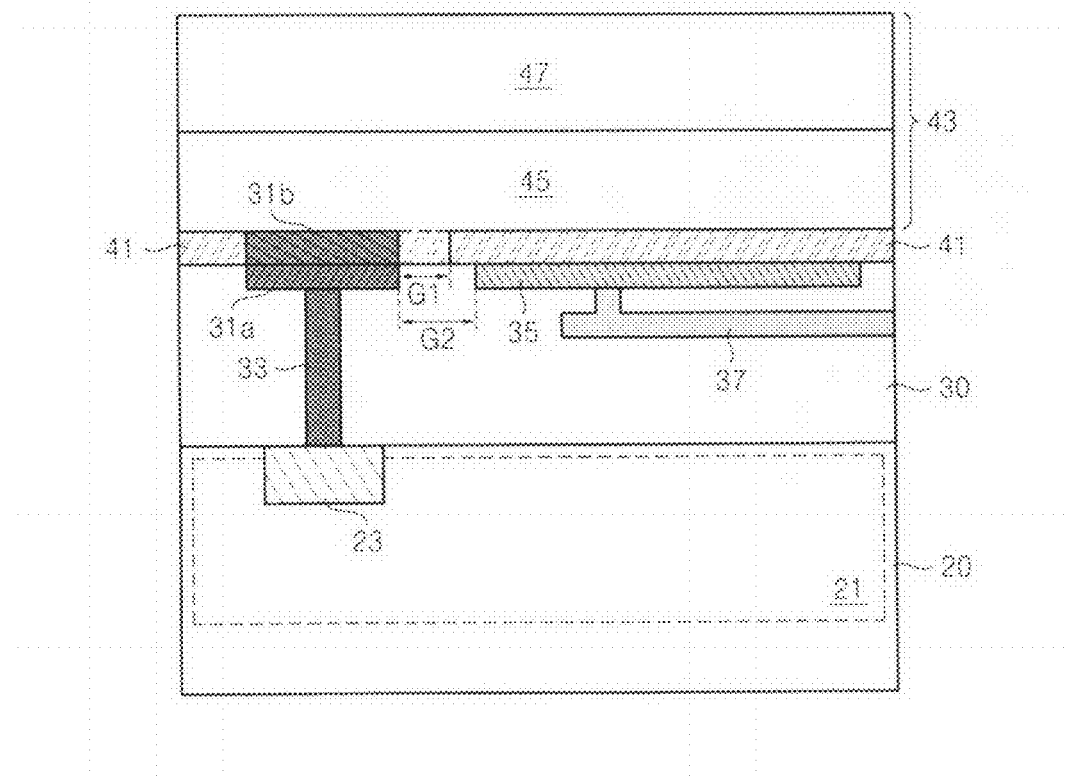
Figure 11F:
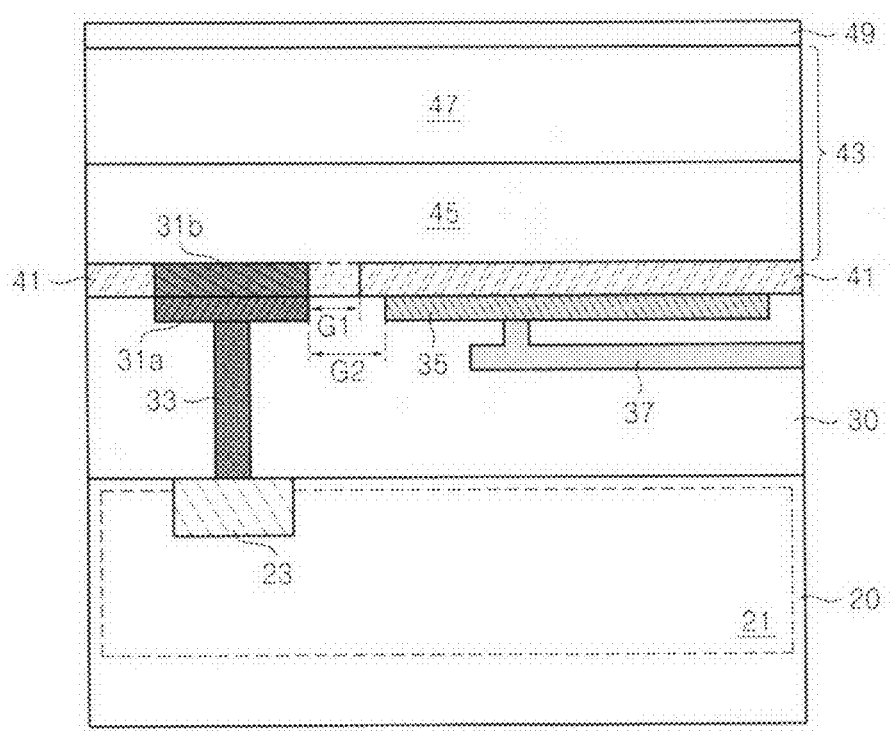

The second contact 31b, e.g., an organic photo-diode contact, may be formed on the first contact 31a (FIG. 11D). The first organic layer 45 may be formed on each of the second contact 31b, the gap G1 and the insulation layer 41, and the second organic layer 47 may be formed on the first organic layer 45 (FIG. 11E). However, when the gap G1 is not formed, the first organic layer 45 may be formed on each of the second contact 31b and the insulation layer 41. The second electrode 49, e.g., a transparent electrode, may be formed on the second organic layer 47 (FIG. 11F).

Figure 12A:
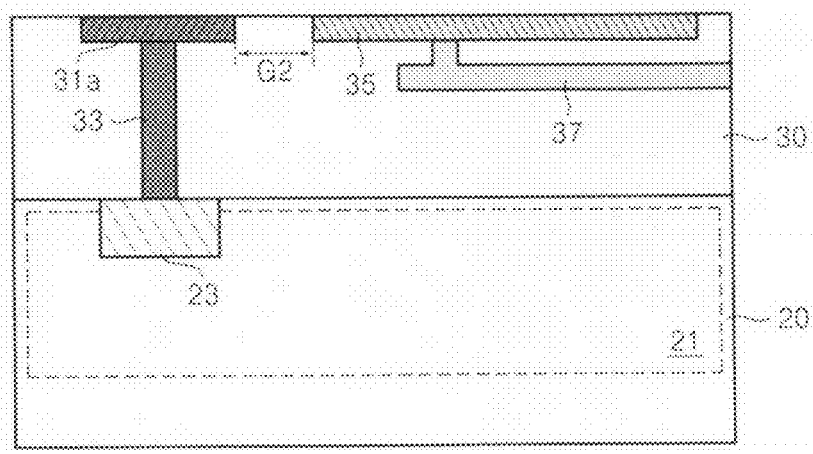
Figure 12B:
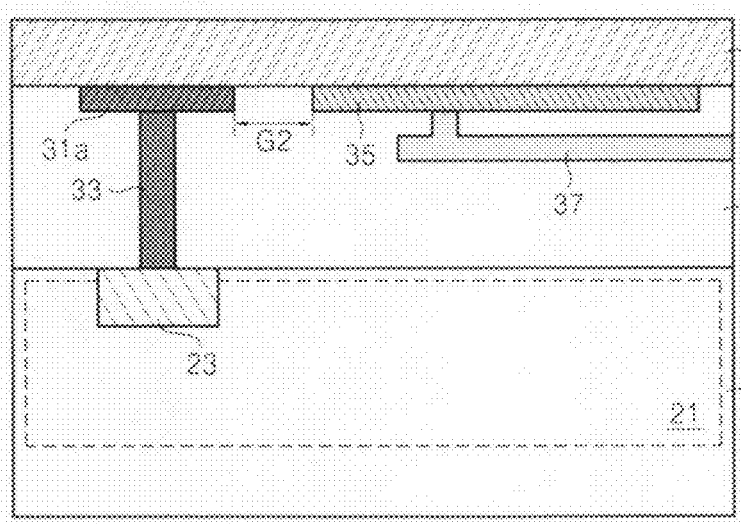

FIGS. 12A to 12G are illustrative of a manufacturing process of the organic pixel illustrated in FIG. 1, according to still another example embodiment. FIG. 12A corresponds to FIG. 10A. The insulation layer 41 may be formed thick on the interconnection layer 30 (FIG. 12B).

Figure 12C:
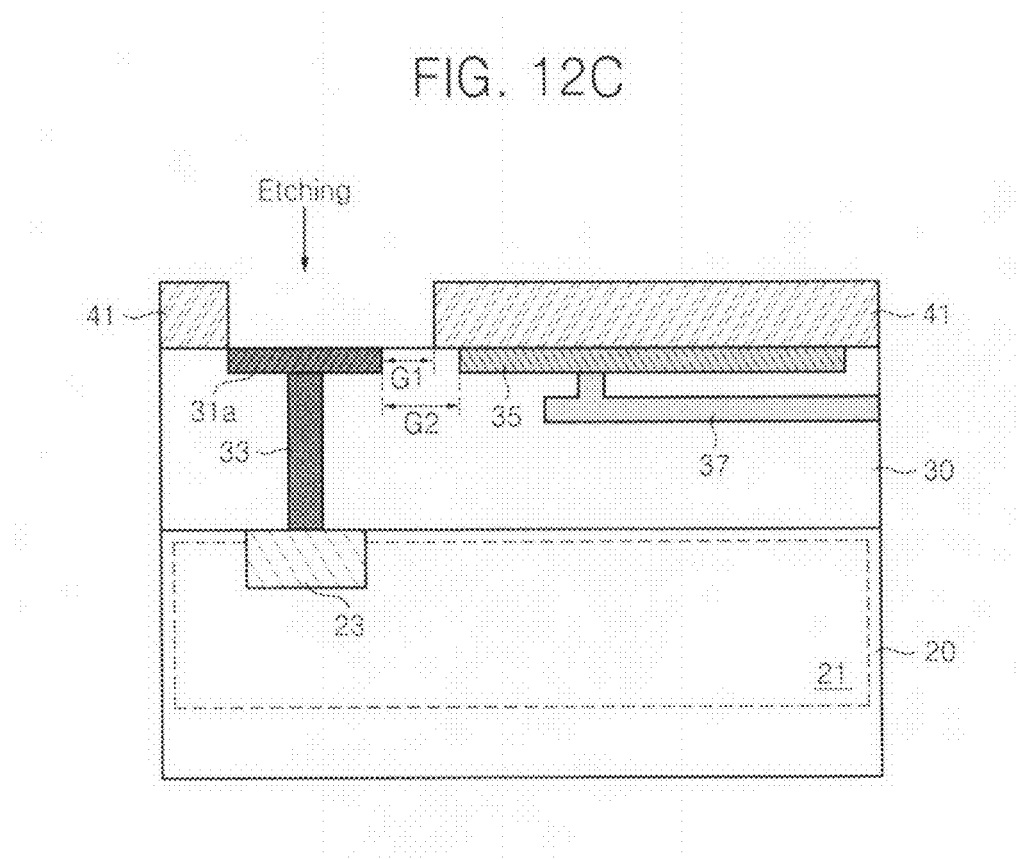

The insulation layer 41 may be etched so that the first contact 31a may be exposed (FIG. 12C). FIGS. 12C to 12F explain a manufacturing process of an organic pixel including the gap G1; however, an organic pixel of the present invention may not include the gap G1.

Figure 12E:
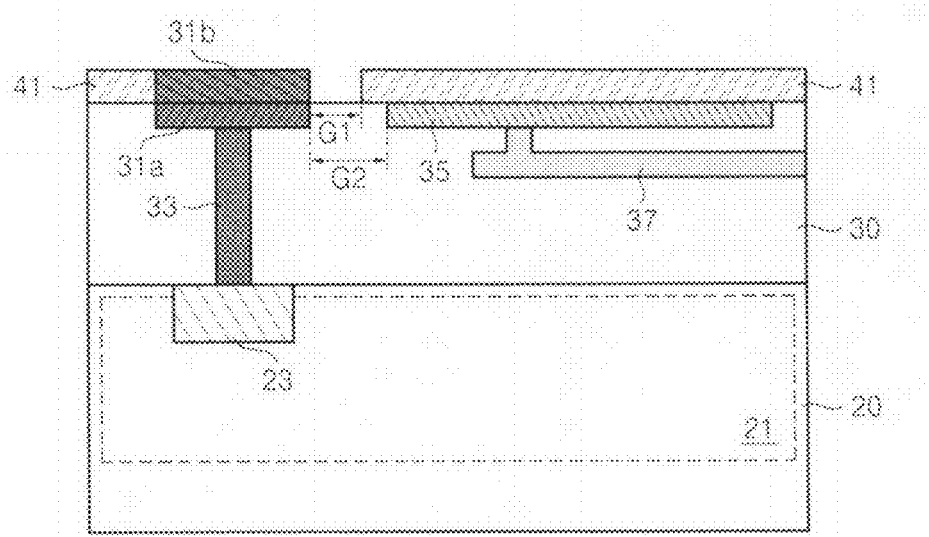
Figure 12F:
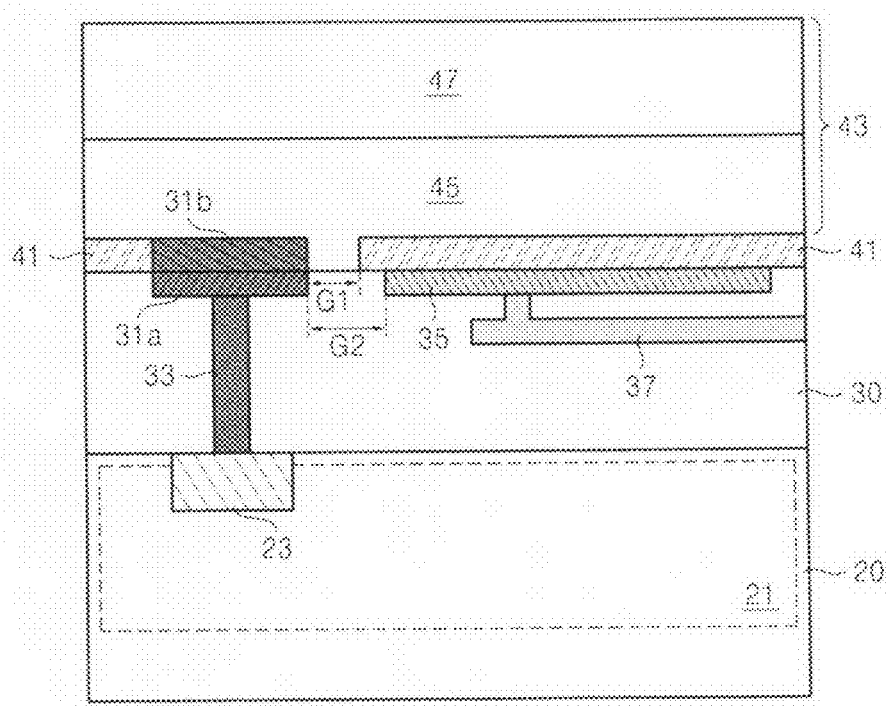
Figure 12G:
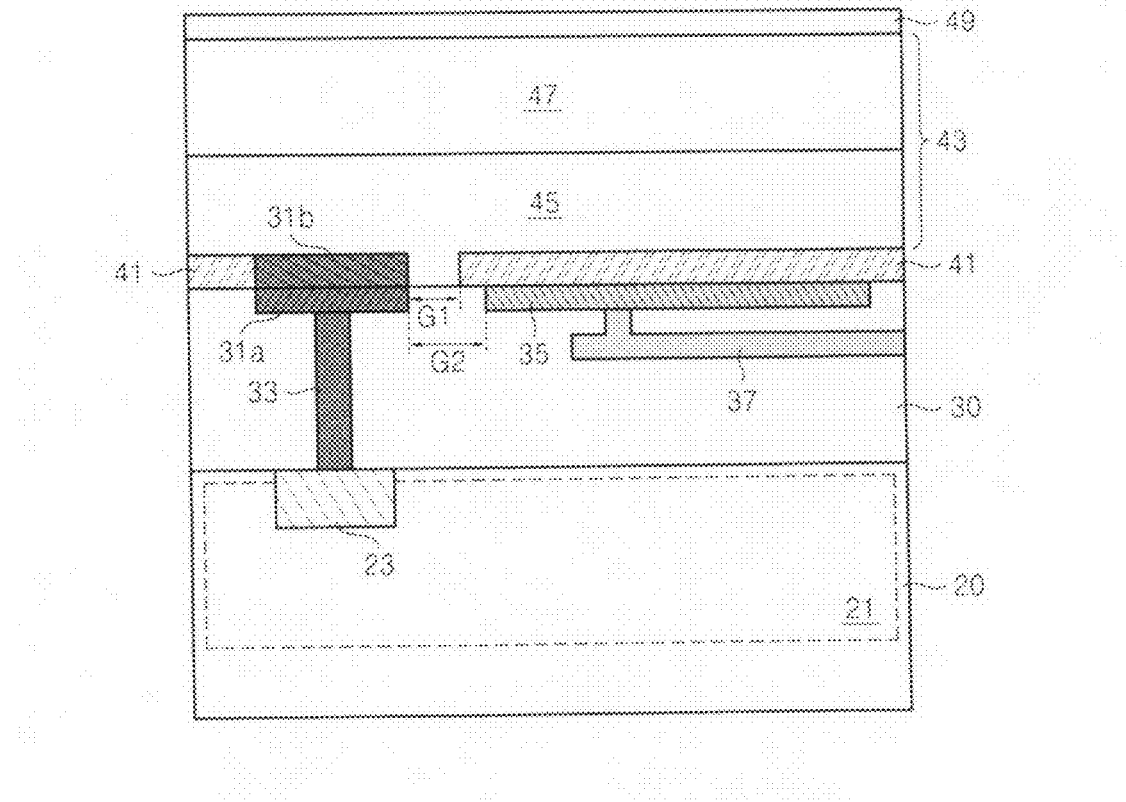

The second contact 31b may be formed on the first contact 31a (FIG. 12D). Besides, the second contact 31b and the insulation layer 41 may be planarized (FIG. 12E). For example, the second contact 31b and the insulation layer 41 may be planarized through a chemical mechanical polishing process (CMP process). The first organic layer 45 may be formed on each of the second contact 31b, the gap G1 and the insulation layer 41, and the second organic layer 47 may be formed on the first organic layer 45 (FIG. 12F). The second electrode 49, e.g., a transparent electrode, may be formed on the second organic layer 47 (FIG. 12G).

As explained above referring to FIGS. 10A to 12G, the second contact 31b and/or the gap G1 may be formed or may not be formed in the manufacturing process of the organic pixel 10 according to example embodiments.

An organic pixel including an organic photo-diode having a structure according to example embodiments may separately perform a charge accumulation operation and a charge transfer operation in response to a voltage of a transfer control signal. The organic pixel may reduce a thermal noise, a kT/C (or kTC) sampling noise thereby, a dark current and/or a shot noise according to the dark current.

In the event that the organic pixel is in an upper part of an image sensor, a fill factor may be easily expanded. Subsequently, optical efficiency may be improved because a photon shot noise may be reduced and/or sensitivity and/or signal to noise ratio of the image sensor may be improved.

In addition, performance of the image sensor may be improved because an image sensor including the organic pixel and a correlated double sampling block may reduce a correlated double sampling noise generated in the correlated double sampling block.

Moreover, as an organic photo-diode may be formed above the semiconductor substrate instead of in the semiconductor substrate, e.g., silicon, a spare room may be created inside the semiconductor substrate. Because the spare room may be used as a space for an active amplifier, a flicker and/or a thermal noise generated in the active amplifier may be further reduced.

While example embodiments have been particularly shown and described with reference to example embodiments thereof, it will be understood by those of ordinary skill in the art that various changes in forms and details may be made therein without departing from the spirit and scope of example embodiments as defined by the following claims.

What is claimed is:

1. An operation method of an organic pixel, which includes an interconnection layer on a semiconductor substrate including a pixel circuit, the interconnection layer including a contact and a first electrode, and an organic photo-diode on the interconnection layer, the organic photo-diode having an insulation layer on the first electrode, a stacked structure of an electron donating organic material and an electron accepting organic material on the insulation layer, and a second electrode on the stacked structure, the operation method comprising:
   receiving a transfer control signal via the first electrode of the organic pixel, the first electrode electrically connected to the insulation layer; and
   performing a charge accumulation operation, which accumulates photo-charges near the insulation layer formed on the first electrode, and a charge transfer operation, which transfers the accumulated photo-charges to the pixel circuit through the contact separated from the electrode,
   wherein the charge accumulation operation is performed when the transfer control signal has a first level voltage, and one of a ground voltage and a negative voltage lower than the ground voltage is supplied to the second electrode, and
   the charge transfer operation is performed when the transfer control signal has a second level voltage lower than the first level voltage, and one of the ground voltage and the negative voltage is supplied to the second electrode.

2. The operation method of claim 1, wherein the electron donating organic material and the electron accepting organic material form a hetero p-n junction.

3. The operation method of claim 1, wherein the accumulated photo-charges are accumulated in a potential well, formed at an area of the organic photo-diode on the insulation layer.

4. The operation method of claim 1, wherein the accumulated photo-charges are transferred to a connection node of the pixel circuit through the contact on the interconnection layer and a via connected to the contact.

5. The operation method of claim 1, wherein a horizontal distance between the contact and the insulation layer is shorter than a horizontal distance between the contact and the electrode.

6. The operation method of claim 1, wherein the contact includes a first contact portion and a second contact portion on the first contact portion, and
   a horizontal distance between the first contact portion and the insulation layer is shorter than a horizontal distance between the first contact portion and the electrode.

7. An organic pixel comprising:
   a semiconductor substrate including a pixel circuit;
   an interconnection layer on the semiconductor substrate, the interconnection layer including a first contact and a first electrode; and
   an organic photo-diode on the interconnection layer,
   wherein the organic photo-diode includes
      an insulation layer on the first electrode,
      a second electrode, and
      a photo-electric conversion region between the first contact, the insulation layer, and the second electrode, the photo-electric conversion region including an electron donating organic material and an electron accepting organic material, and
   wherein the first contact is disposed apart from the first electrode.

8. The organic pixel of claim 7, wherein a horizontal distance between the first contact and the insulation layer is shorter than a horizontal distance between the first contact and the first electrode.

9. The organic pixel of claim 7, wherein the organic photo-diode further includes a second contact electrically connected to the first contact, and
   a horizontal distance between the second contact and the insulation layer is shorter than a horizontal distance between the first contact and the first electrode.

10. The organic pixel of claim 7, when a transfer control signal having a first level is supplied to the first electrode through a metal line connected to the first electrode, and one of a ground voltage and a negative voltage lower than the ground voltage is supplied to the second electrode, a potential well where a plurality of photo-generated charges are accumulated is formed at an area of the organic photo-diode on the insulation layer.

11. The organic pixel of claim 10, wherein the interconnection layer includes a via connecting the first contact with a connection node of the pixel circuit, and
   when the transfer control signal having a second level lower than the first level is supplied to the first electrode through the metal line, and one of the ground voltage and the negative voltage is supplied to the second electrode, a plurality of photo-generated charges accumulated in the potential well are supplied to the pixel circuit through the first contact, the via, and the connection node.

12. An image sensor comprising:
   an organic pixel; and
   a row driver configured to output a transfer control signal for controlling a charge transfer operation of the organic pixel,
   wherein the organic pixel includes
      a semiconductor substrate including a pixel circuit,
      an interconnection layer on the semiconductor substrate, the interconnection layer including a first contact and a first electrode, and an organic photo-diode on the interconnection layer,
   wherein the organic photo-diode includes
      an insulation layer on the first electrode,
      a second electrode, and
      a photo-electric conversion region between the first contact, the insulation layer, and the second electrode, the photo-electric conversion region including an electron donating organic material and an electron accepting organic material, and
   wherein the first contact is disposed apart from the first electrode.

13. The image sensor of claim 12, wherein a horizontal distance between the first contact and the insulation layer is shorter than a horizontal distance between the first contact and the first electrode.

14. The image sensor of claim 12, wherein the organic photo-diode further includes a second contact electrically connected to the first contact, and a horizontal distance between the second contact and the insulation layer is shorter than a horizontal distance between the first contact and the first electrode.

15. The image sensor of claim 12, when the transfer control signal having a first level voltage is supplied to the first electrode through a metal line connected to the first electrode, and one of a ground voltage and a negative voltage lower than the ground voltage is supplied to the second electrode, a potential well where a plurality of photo-generated charges are accumulated is formed at an area of the organic photo-diode on the insulation layer.

16. The image sensor of claim 15, wherein the interconnection layer includes a via connecting the first contact with a connection node of the pixel circuit, and when the transfer control signal having a second level voltage lower than the first level voltage is supplied to the first electrode through the metal line, and one of the ground voltage and the negative voltage is supplied to the second electrode, a plurality of photo-generated charges accumulated in the potential well are supplied to the pixel circuit through the first contact, the via, and the connection node.

17. An image processing device comprising:
the image sensor of claim 12; and
a processor configured to control an operation of the image sensor.

18. The image processing device of claim 17, wherein a horizontal distance between the first contact and the insulation layer is shorter than a horizontal distance between the first contact and the first electrode.

19. The image processing device of claim 17, wherein the organic photo-diode further includes a second contact electrically connected to the first contact, and a horizontal distance between the second contact and the insulation layer is shorter than a horizontal distance between the first contact and the first electrode.

* * * * *